(12) United States Patent
Vanderberg et al.

(10) Patent No.: US 7,064,340 B1
(45) Date of Patent: Jun. 20, 2006

(54) METHOD AND APPARATUS FOR ION BEAM PROFILING

(75) Inventors: Bo H. Vanderberg, Gloucester, MA (US); Michael P. Cristoforo, Beverly, MA (US); Kevin W. Wenzel, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/012,585

(22) Filed: Dec. 15, 2004

(51) Int. Cl.
*H01J 37/317* (2006.01)

(52) U.S. Cl. ................... 250/492.21; 250/397

(58) Field of Classification Search .......... 250/492.21, 250/397, 398
See application file for complete search history.

(56) References Cited

U.S. PATENT DOCUMENTS

| | | | |
|---|---|---|---|
| 4,021,675 A | 5/1977 | Shifrin | |
| 4,361,762 A * | 11/1982 | Douglas | ............ 250/251 |
| 4,494,005 A | 1/1985 | Shibata et al. | |
| 4,922,106 A | 5/1990 | Berrian et al. | |
| 5,198,676 A | 3/1993 | Benveniste et al. | |
| 6,313,474 B1 | 11/2001 | Iwasawa et al. | |
| 6,677,598 B1 | 1/2004 | Benveniste | |
| 6,677,599 B1 | 1/2004 | Berrian | |
| 6,765,219 B1 | 7/2004 | Berrian et al. | |

FOREIGN PATENT DOCUMENTS

WO          WO 01/51183 A1     7/2001

OTHER PUBLICATIONS

Olson, J. C., et al., "Scanned Beam Uniformity Control in the VIISta 810 Ion Implanter," IEEE 1998 International Conference on Ion Implantation Technology, pp. 169-172.
Nagai, N., et al., "Nissin 300 mm Medium Current Ion Implanter EXCEED 2300," IEEE 2000 International Conference on Ion Implantation Technology pp. 415-418.

\* cited by examiner

*Primary Examiner*—Kiet T. Nguyen
(74) *Attorney, Agent, or Firm*—Watts Hoffmann Co., L.P.A.

(57) ABSTRACT

An ion beam current density profiler includes a pair of counter-rotating cylindrical masks each featuring a helical slot. The intersection of the slots forms an aperture that scans the width of a ribbon ion beam to allow discrete portions of the beam to impact an inner, concentric current collecting cylinder.

16 Claims, 6 Drawing Sheets

METHOD AND APPARATUS FOR ION BEAM PROFILING

TECHNICAL FIELD

The invention concerns generally the field of ion implantation for semiconductor fabrication and more particularly a method and apparatus for obtaining an ion dose profile for an ion beam.

BACKGROUND

Many operations performed during semiconductor fabrication involve bombarding a wafer workpiece with charged particles to "dope" the workpiece by forming layers or pockets on the workpiece that have a relatively high concentration of a given type of particle. To accomplish this doping, ion beams are created to carry desired particles to a workpiece and impact the surface of the workpiece. The ion beam can be in the form of a pencil beam that is scanned across a workpiece surface or a ribbon beam that has a width slightly larger than the diameter of the workpiece. In the case of the ribbon beam, the beam is often stationary and the workpiece is moved through the beam to effect ion bombardment of the entire workpiece surface.

In order to achieve uniform ion implantation across the surface of the workpiece with a ribbon beam, it is desirable to accurately control the current density of the ribbon beam. Two dimensional current measurement of the ribbon beam is necessary to determine whether the current density is constant throughout the ribbon beam. Presently, a traveling dosimetry cup is utilized in some ion implantation machines that feature a ribbon ion beam. The dosimetry cup is scanned linearly across the ribbon beam to measure current density as a function of location within the beam. While this technique has been used quite successfully in commercially available ion implantation machines, the relatively slow speed of the mechanical motion, which is a translation across the ribbon with acceleration and deceleration at the edges of the ribbon, may slow ion beam setup time.

SUMMARY

An ion beam dosimetry apparatus includes a conducting surface that produces a current in response to the impact of ions in the ion beam that corresponds to a dose of ions present in the ion beam. A pair of overlaid masks each having a slot formed therein is provided. The slots intersect to form a movable aperture disposed between an ion beam source and the conducting surface. The aperture moves when at least one of the masks is moved relative to the other.

In an exemplary embodiment, the conducting surface is an outer surface of a hollow rod made of a conductive material and the pair of overlaid masks are formed into a pair of concentric cylinders surrounding the hollow rod. The slots are configured such that relative motion between the masks causes the aperture to trace a scanning pattern across the beam such that all areas of the beam encounter the aperture during the scanning pattern. A suppression electrode may be positioned within the inner mask or one or more suppression magnets may be contained within the hollow rod to limit the escape of secondary electrons caused by beam impact.

The overlaid masks and conducting surface may be removably positioned between a workpiece mounting structure and the ion beam source or behind a workpiece support structure such that the overlaid masks and conducting surface are downstream of the workpiece support structure with respect to the path of the ion beam.

DETAILED DESCRIPTION

Ion Implantation System Overview

Figure 1:
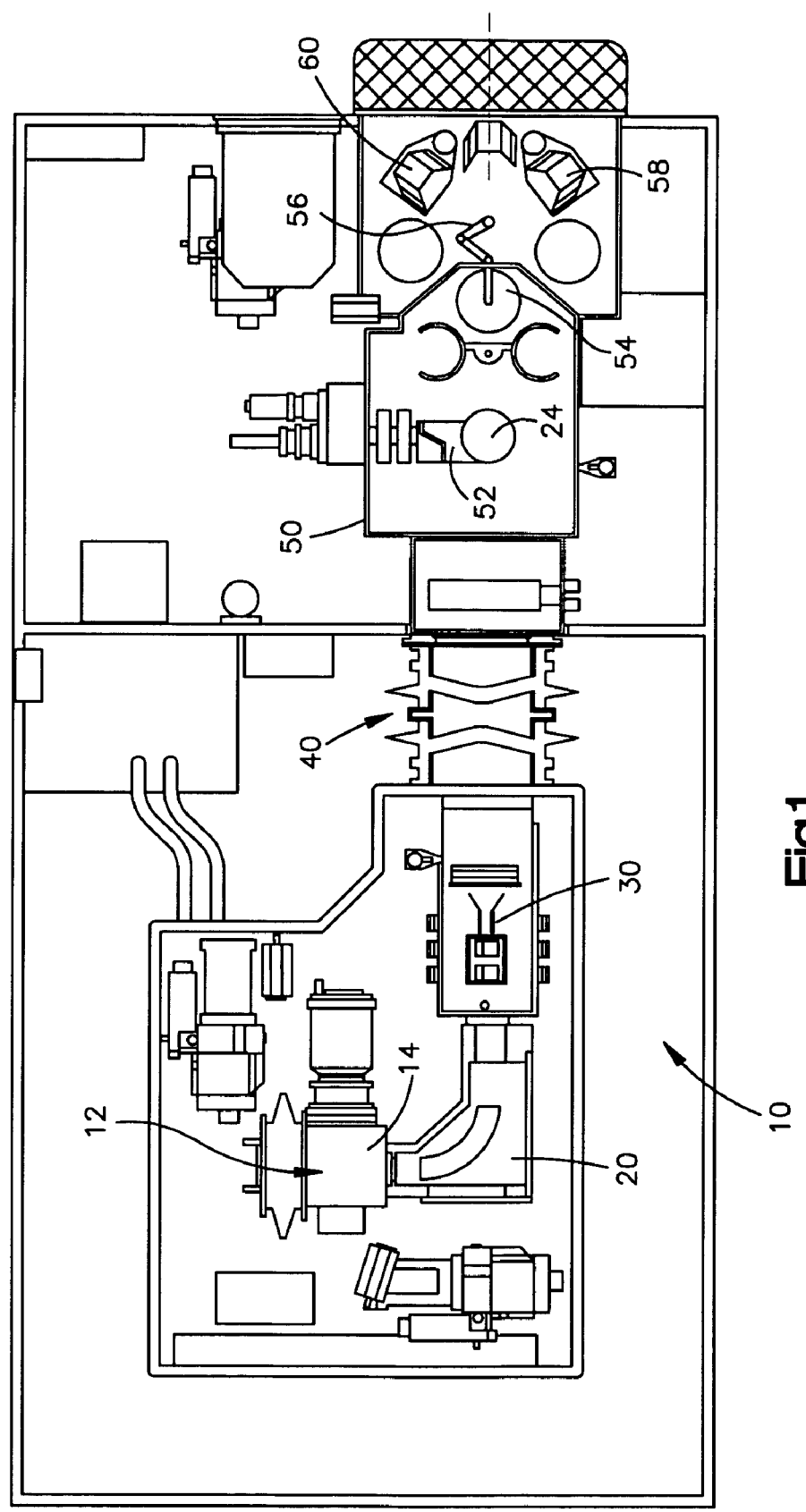
FIG. 1 is a schematic overview of an ion implantation system including a serial end station in an implantation chamber.

FIG. 1 is a schematic depiction of an ion implanter 10 such as Axcelis model Optima SMX medium current ion implanter sold by the assignee of the present invention. Such an implanter is used for ion beam treatment of work-pieces such as silicon wafers for selective doping of those wafers. In such an implanter positive ions strike the work-piece after traversing a beam path from a source to an implanter station. Although the ion implanter 10 depicted in FIG. 1 is a medium current ion implanter other types of implanters that create a ribbon beam, including high energy implanters having a linac for accelerating ions or implanters with multiple wafer end stations, can also benefit from use of the invention.

The exemplary ion implanter 10 includes an ion source 12 for emitting ions generated from a source material. Typical source materials are either gases injected into a source housing 14 or solids that are vaporized to produce a plasma of ions within the source housing. As is well known in the prior art such a source 12 typically includes an extraction electrode for causing ions to exit the housing 14 along a beam path away from the source.

The implanter 10 depicted in FIG. 1 also includes a mass discriminating magnet 20 for bending ions away from an initial trajectory along a path of ion travel downstream from the ion source. Different species of the same ion are produced in the source 12 and the magnet discriminates between theses species. Ions of an undesirable mass are filtered by the magnet so that ions exiting the mass analyzing magnet 20 are of a single species of the ion used in beam treatment of a workpiece.

The ion implanter 10 also includes a beam scanning structure 30 which is positioned to intercept ions subsequent to the mass discriminating magnet 20 and scan ions from side to side in a controlled manner to form a ribbon like ion beam having a width. In one known design the scanning structure uses an electrostatic field that is created between two scan plates that are approximately 15 cm long and spaced apart by 5 cm. This separation expands outwardly to a separation of about 7.5 cm at an exit end of the two scanning electrodes. Alternate means of creating a ribbon beam are use of time varying magnetic fields and use of structure that defines the beam exiting the source prior to species discrimination.

Returning to the exemplary structure shown in FIG. 1, a lens structure 40 accepts ions moving along diverging paths from the scanning structure 30 and bends them as they are accelerated across a gap between curved electrodes to create substantially parallel ion trajectories for ions leaving the lens structure 40. Subsequent to leaving the lens structures 40, the ions that make up the beam are moving in generally parallel directions and form a thin ribbon or ribbon-like beam 42. (See FIGS. 2 and 3) This ribbon beam enters the implantation chamber 50 to act upon the wafer workpiece 24.

A workpiece 24 is moveably supported within an ion implantation chamber 50 by a workpiece support structure 52. The workpieces 24, which are typically wafers of semiconductor material, are inserted into the chamber 50 by means of a load lock 54. Outside the chamber 50 the wafers are manipulated by a robot 56 which extracts untreated wafers from a storage cassette 58 and returns treated wafers to a second cassette 60 or alternatively can return the treated wafers from the same cassette from which they were withdrawn.

Figure 2:
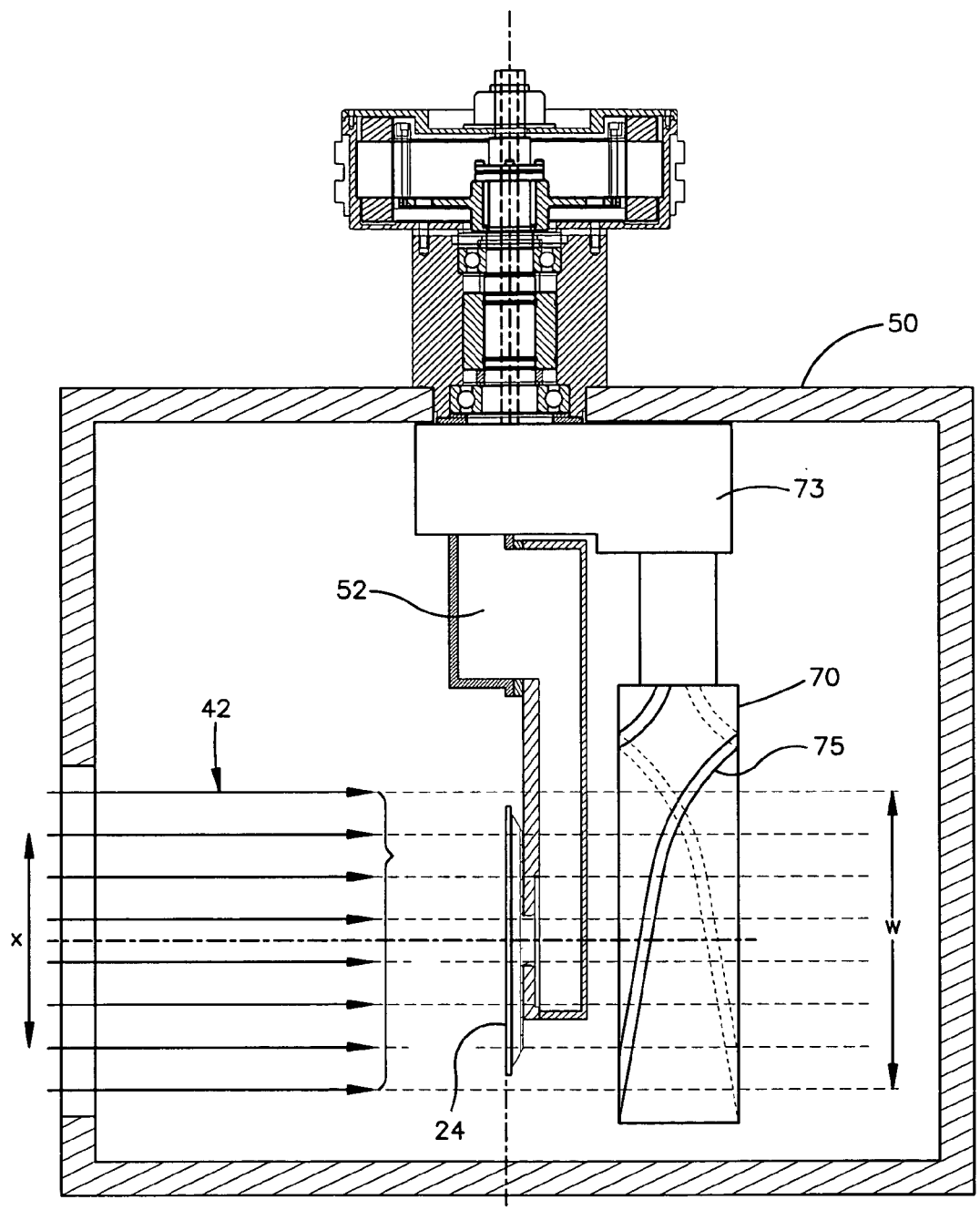
FIG. 2 is a cut away top view of the implantation chamber of FIG. 1 illustrating an ion beam profiling apparatus constructed according to an embodiment of the present invention.
Figure 3:
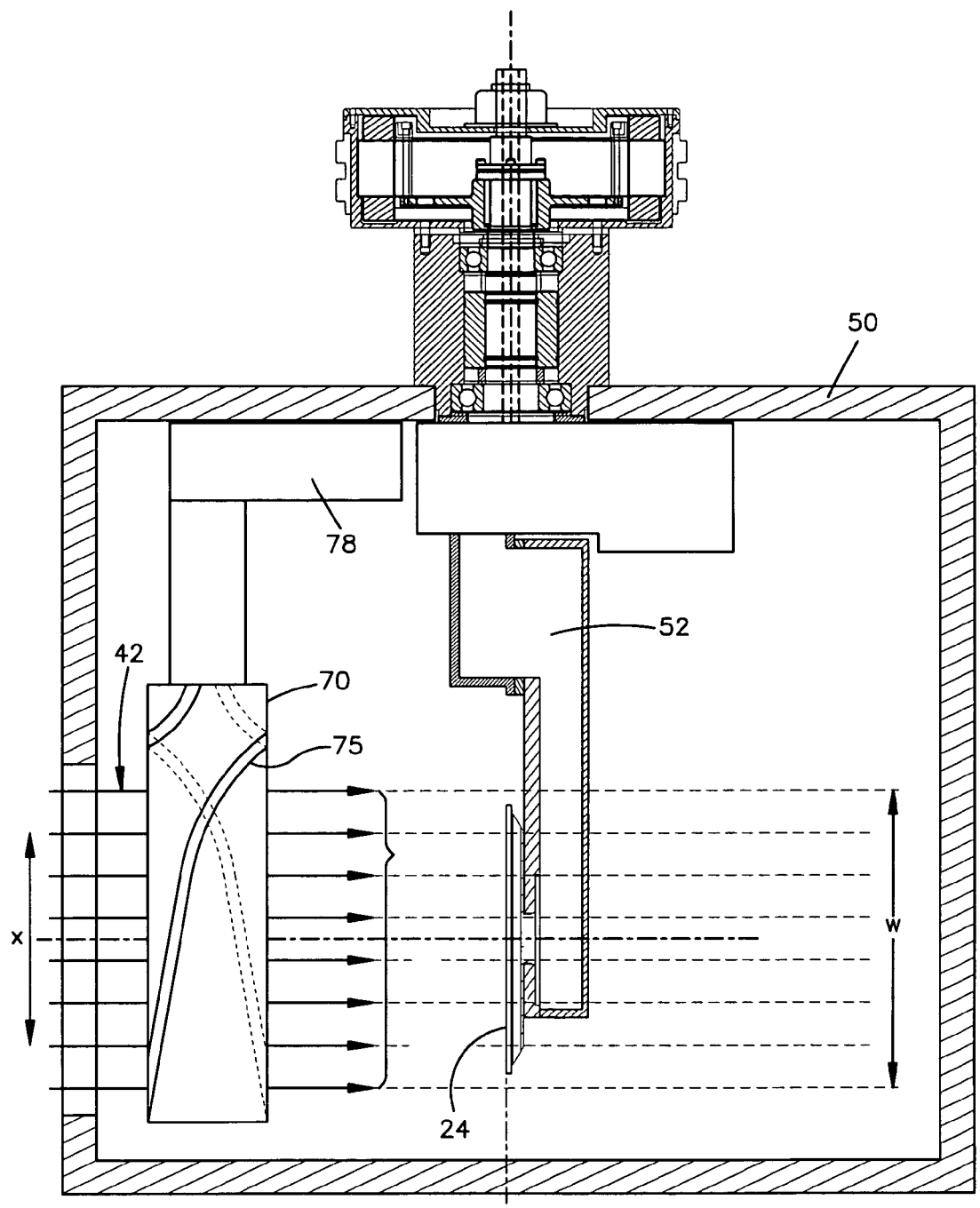
FIG. 3 is a cut away top view of the implantation chamber of FIG. 1 illustrating an ion beam profiling apparatus constructed according to another embodiment of the present invention.

As can be seen in FIGS. 2 and 3, generally, the extent of the ribbon ion beam 42 is sufficient to implant an entire implantation surface of the workpiece 24. That is, if the workpiece 24 has a diameter of 300 mm, the scanning electrodes 30 is energized such that a horizontal extent or width, W of the ribbon ion beam 42 upon entering the implantation chamber, will be at least 300 mm. Since only one segment of the ribbon beam impacts any given portion of the workpiece surface, it is important that the current density of the ribbon beam be relatively constant so that a uniform dose of ions is applied across the entire surface.

The workpiece support assembly 52 both supports and moves the workpiece 24 with respect to the ribbon ion beam 42 during implantation such that a desired implantation surface of the workpiece 24 is controllably implanted with ions. As mentioned previously, in addition to the scanning technique described above, those of skill in the art will recognize that the ribbon shape of the ribbon ion beam 42 within the implantation chamber 50 can be created in a number of alternate ways.

A more detailed description of a prior art ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

Ion Beam Profiling Apparatus

As will be described in more detail below, to accurately obtain a two dimensional current density profile of a ribbon shaped ion beam, a cylindrical shaped profiler is placed in the path of the ion beam. The profiler has a scanning aperture formed by two overlaid mask cylinders surrounding a concentric current collecting cylinder or rod that registers an induced current proportional to a quantity of ions passing through the aperture and impacting the surface of the current collecting cylinder. The scanning aperture is much smaller than the cross section of the beam, in one embodiment the aperture is approximately 6 mm by 6 mm and forms a diamond shape. With these dimensions, the aperture is about one quarter of the width and one fiftieth of the height of a typical ion beam that acts upon a 300 mm wafer workpiece.

FIGS. 2 and 3 depict a top view of the ion beam profiler 70 mounted in two alternative locations in the implantation chamber 50 with respect to the workpiece. In the embodiment shown in FIG. 2, the profiler 70 is mounted downstream of the workpiece support 52 with respect to the ion beam path 42 by way of a profiler support 73. The profiler support 73 maintains the profiler in a static position such that any time the workpiece support 52 moves out of the beam path, the profiler is positioned to perform a beam profile. This mounting scheme is advantageous because the profiler is in place to determine the beam profile before and after each implant. In addition the profiler can sample the portions of the ion beam that do not impact the wafer as the wafer is scanned through the ion beam. The implanter control system can use the information concerning beam profile before any given implant cycle to calculate an implant time that provides a correct does based on up-to-date information about the beam. In addition, the profiler can detect beam glitches or drop out during implantation by sampling the outer edges of the beam that are not impacting the wafer during implantation. Two disadvantages of this profiler mounting configuration include nearly constant exposure to the ion beam and a high duty cycle, both of which can lead to earlier wear out of profiler components.

Figure 7:
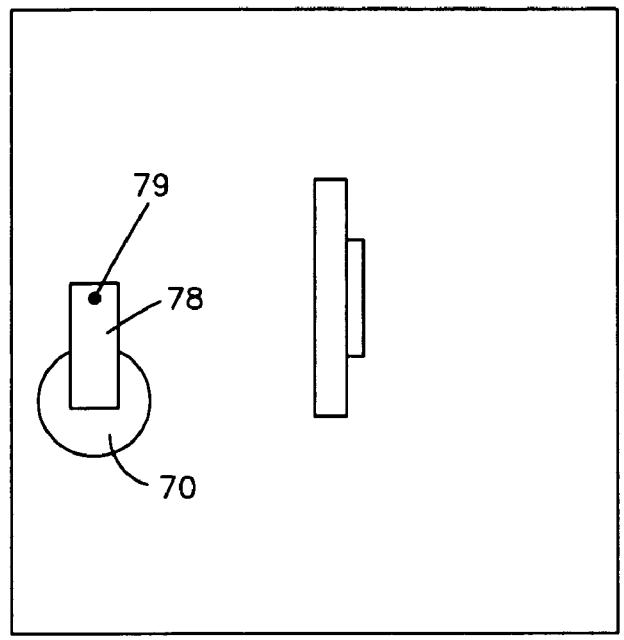
FIG. 7 is a side schematic view of the implantation chamber of FIG. 3.

FIG. 3 shows the profiler in an alternative mounting configuration in which the profiler 70 is mounted to a moveable mount 78 that rotates about a pivot point 79 to selectively place the profiler in the beam path. By adjusting the rotational position of 78, the profiler can be placed in the ion beam path at the same angle as the implantation angle of the workpiece. When the profiler is not in the beam path, it is parked below the beam in front of the workpiece 24 by rotating the moveable mount 78 as shown in the side view of FIG. 7. When profiling is to occur, the profiler is rotated into the beam from below. The profiling scan takes a few seconds and when it is complete, the profiler is moved back to the park position. This mounting configuration requires additional cycle time to bring the profiler into and out of the beam path. However, because the profiler is only in the beam path intermittently, the wear of profiler components is reduced. In the described embodiment the park position is in front of and below the workpiece implantation position. This is because during implantation, the workpiece is tilted around a horizontal axis and moves in a constant focal length scan in the vertical direction, or 0–45 degrees from vertical for implants requiring a tilt angle. In this configuration, a Faraday plate (not shown) may be necessary to detect beam glitches or drop out as well as dosimetry cups to the left and right of the workpiece for dosimetry. In this particular embodiment, these additional components limit packaging space for the profiler in the implantation chamber 50 to the position shown in FIG. 3.

Figure 4:
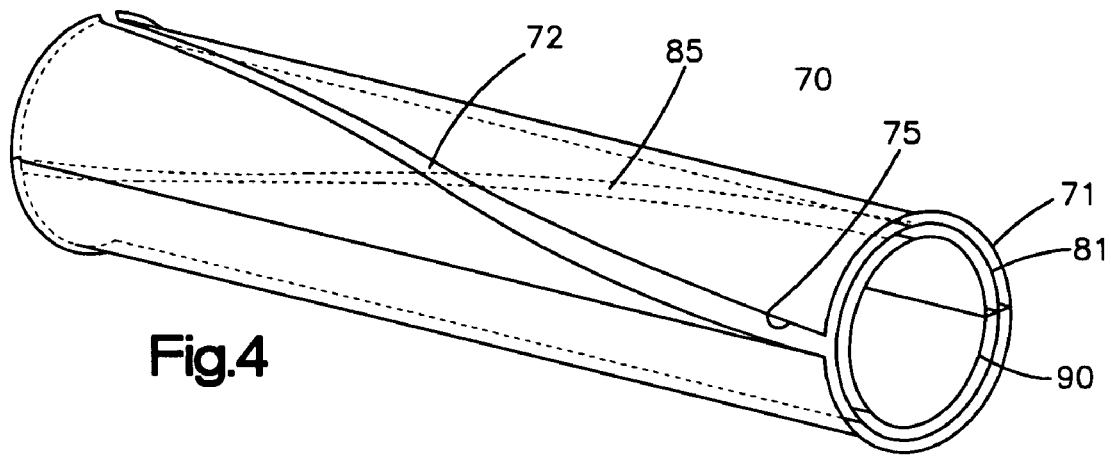
FIG. 4 is a perspective view of a part of the ion beam profiling apparatus of FIGS. 2 and 3.
Figure 5:
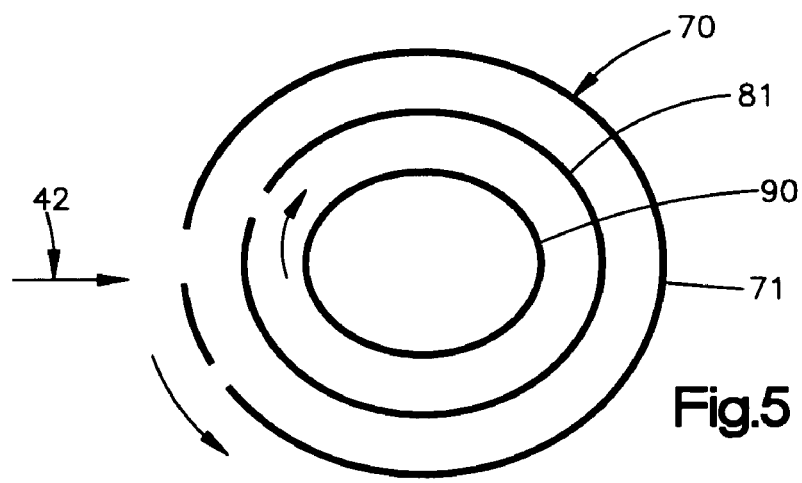
FIG. 5 is a side schematic view of the ion beam profiling apparatus of FIG. 4.
Figure 6:
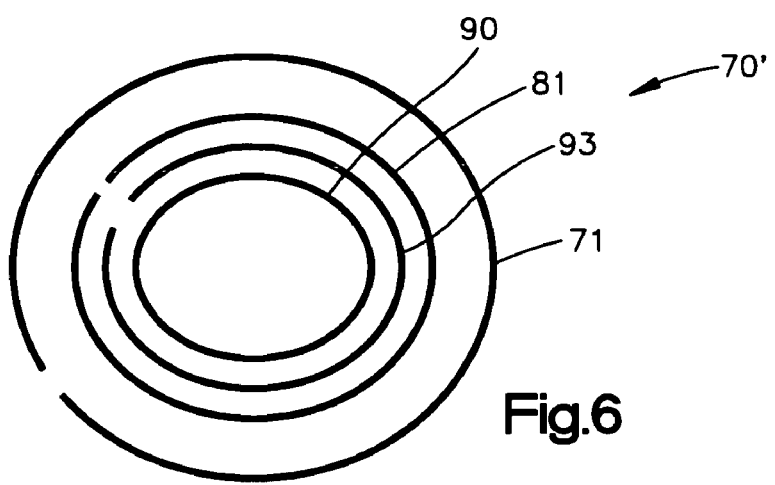
FIG. 6 is a side schematic view of an ion beam profiling apparatus constructed according to another alternative embodiment of the present invention.

FIGS. 4–6 depict the ion beam profiler 70 in more detail. A pair of concentric mask cylinders including an outer mask 71 and an inner mask 81 surround a concentric current collecting cylinder 90. The outer mask 71 has an outer helical slot 75 and the inner mask 81 has an inner helical slot 85 (shown in phantom) that proceeds around the inner mask in opposite azimuthal direction about the center axis of the cylinders. The current collecting cylinder has a diameter at least as large as the expected height of the ribbon beam. The current collecting cylinder is stationary and is attached to a current measurement device to quantity current passing through the aperture 72 resulting at the intersection of the slots in the inner and outer masks.

In the described embodiment, each of the inner and outer masks has a single slot that completes a single revolution of the respective mask and the masks rotate in opposite directions as shown in FIG. 5. However, any number of whole or fractional revolutions of the mask can be completed by the slots in the practice of the invention. The two masks are rotated in opposite directions as indicated in FIG. 5 with rotational velocities sufficiently different to get the smallest possible pitch and not related by a harmonic so that the beamlet passing through the masks travels across the cross-section of the ribbon beam. The faster the rotation velocities, the faster the data collection of the profiler (up to mechanical limits). In practice, mechanical function is usually the limiting factor with respect to the speed with which data can be collected.

The angular position of the masks can be known at any time by reading encoder positions on the rotational drives of the cylinder and deconvolving the collected current waveform into a two dimensional profile of the ion beam as follows: Each slot can be described as a parametric curve in cylindrical coordinates:

$\{H_1(\rho,\omega,z) = (\rho, k_1 z, z)$ $\{H_2(\rho,\omega,z) = (\rho, k_2 z, z)$ where it is assumed that the cylinders to be thin and of equal radii $\rho$. If each cylinder is rotating with its individual angular velocity $\omega_1$, and $\omega_2$, respectively, the slots can be described by parametric curves:

$\{H_1(\rho,\omega,z;t) = (\rho, k_1 z + \omega t, z)$ $\{H_2(\rho,\omega,z;t) = (\rho, k_2 z + \omega t, z)$ The beam passes through the intersection point of the two slots, that is, through a point:

$P_i \epsilon H_1 \cap H_2$ or, analytically, $P_i = (\rho_i, \omega_i, z_i)$ satisfies $H_1(P_i;t) = H_2(P_i;t)$. So:

$k_1 z_i + \omega_1 t = k_2 z_i + \omega_2 t$ wherefrom:

$$z_i = \frac{\omega_2 - \omega_1}{k_1 - k_2} t$$

The intersection point $P_i$ is thus described by:

$$P_i(t) = \left(\rho, \frac{k_2 \omega_1 - k_1 \omega_2}{k_2 - k_1} t, \frac{\omega_2 - \omega_1}{k_1 - k_2} t\right)$$

which corresponds to a helical path. The pitches of the two helical slots $k_1$, and $k_2$ should not be equal for a smooth trajectory, that is, $k_1 \neq k_2$. In described embodiment, the pitches run in opposite azimuthal directions (clockwise and counter-clockwise around the z-axis), that is, $k_1$, and $k_2$ are of opposite signs and the denominators in the pitches of the intersection points are never zero. If the pitch of each slot is equal and of opposite direction so that $k_1 = -k_2 = k$, the intersection point becomes:

$$P_i(t) = \left(\rho, \frac{\omega_1 + \omega_2}{2} t, \frac{\omega_1 - \omega_2}{2k} t\right)$$

In the described embodiment, the slots do not revolve more than one turn around each cylinder to avoid multiple intersection points along the length of each cylinder. Given exactly on turn on a cylinder of length l, then $k = 2\pi/l$, and:

$$P_i(t) = \left(\rho, \frac{\omega_1 + \omega_2}{2} t, \frac{\omega_1 - \omega_2}{4\pi} lt\right)$$

The expression can be rewritten with a normalized axial coordinate:

$$\lambda = \frac{\omega_1 - \omega_2}{4\pi} lt$$

so that $$P_i(t) = \left(\rho, \frac{2\pi}{l} \frac{\omega_1 + \omega_2}{\omega_1 - \omega_2} \lambda, \lambda\right)$$

In the described embodiment, the pitch of the intersection point helix is small to achieve good spatial resolution of the two dimensional profile, that is, that the expression $$\frac{\omega_1 + \omega_2}{\omega_1 - \omega_2} \gg 1.$$

Since $$\lim_{x \to \infty} \frac{x + y}{x - y} = 1,$$

the solution is to have $\omega_1$, $\omega_2$ but not $\omega_1 = \omega_2$ (since synchronous motion would not give a traveling intersection point).

Mapping of the intersection point to a cross-section of an incident ribbon ion beam is a simple mapping of cylindrical coordinates to Cartesian. One condition is that the intersection point is on the right side of the current collecting cylinder, for example, $\omega_i \epsilon [0,\pi]$. Thereby the expressions for an x-y profile is obtained:

$x = \rho \cdot \cos(\omega_i)$ $y = z_i$

In other embodiments any number of slots can be featured on the masks and both slots could proceed in the same azimuthal orientation around the cylinder in a manner that advantageously ensures that the beam may not pass simultaneously through two apertures. For example, one or both of the masks could have two slots separated azimuthally by 180 degrees.

It is known that secondary electrons generated by the beam ions impacting the collecting rod may tend to move away from the collecting cylinder's surface and cause inaccuracies in the current measured by the profiler. FIG. 6 illustrates a profiler 70' in which the inner mask 81 includes an additional electrostatic suppression element 93 that, in this embodiment, is a negatively charged electrode placed between the inner mask 81 and the collecting rod 90. The secondary electrons are repelled by the field around the electrode 93 and are driven back to the surface of the collecting cylinder, improving the accuracy of the current measured by the profiler.

Figure 9:
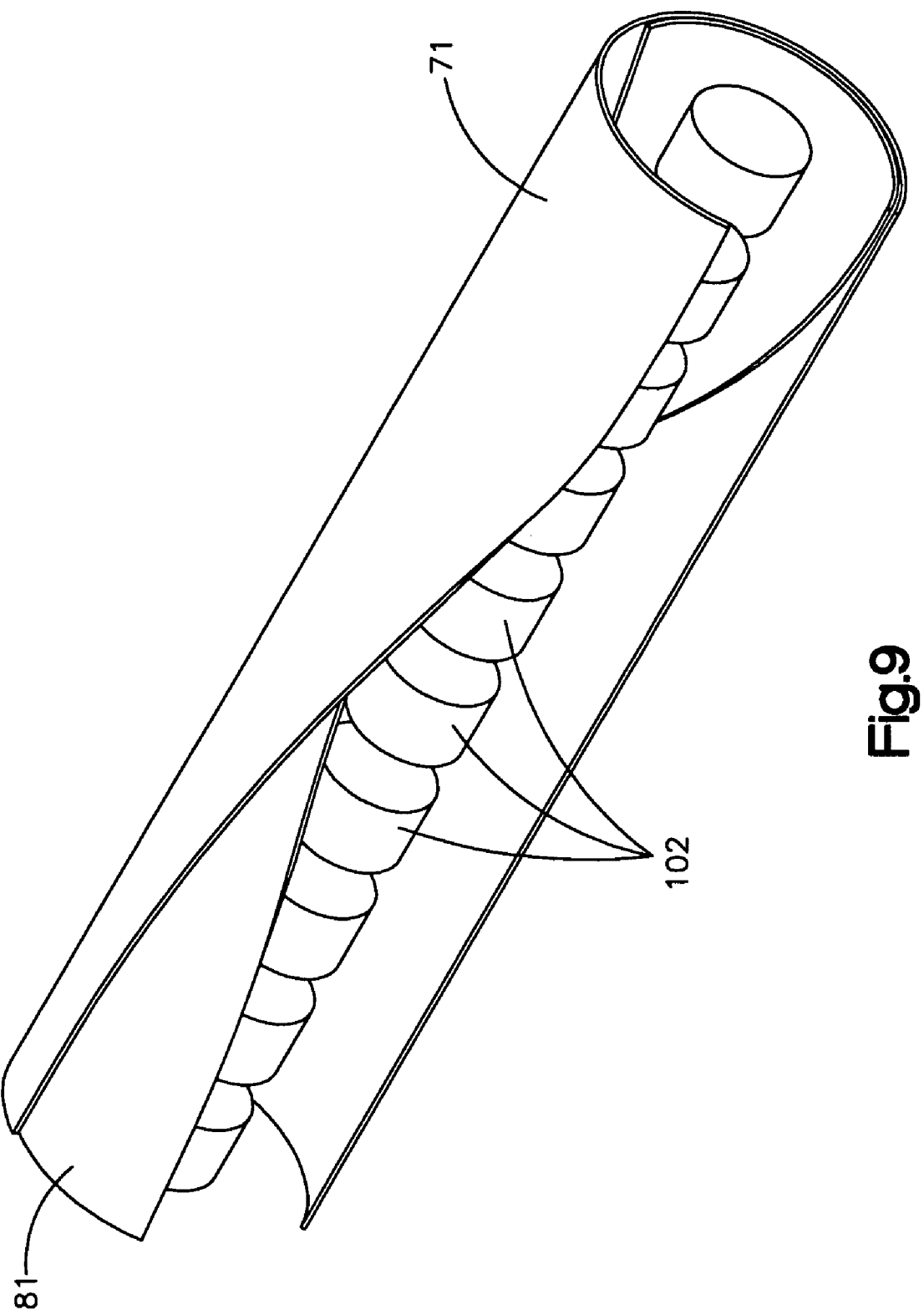
FIG. 9 is a perspective view of a part of an ion beam profiling apparatus constructed according to an alternative embodiment of the present invention.

FIG. 9 shows a profiler embodying an alternative magnetic suppression technique. Magnetic suppression immerses the collecting surface with a transverse magnetic field, so that the secondary electrons gyrate half a turn in the magnetic field and return to the collecting surface. To achieve this transverse magnetic field in the profiler shown in FIG. 9, one or more cylindrical cusp magnets 102 are pressed into the collecting cylinder (which is not shown in FIG. 9 for clarity). The magnets are magnetized in the axial direction, with alternating polarity to produce a magnetic field that is present at the cylinder surface, but diminishes in strength relatively quickly in a direction away from the surface. The collecting cylinder is thus magnetically suppressed by an axial cusp field and the magnetic field outside the profiler is relatively weak.

Because the profiler features masks that rotate at constant velocities, no acceleration or deceleration of the masks is required during profiling, increasing the speed with which profiling can be accomplished, possibly in less than one second.

Figure 8:
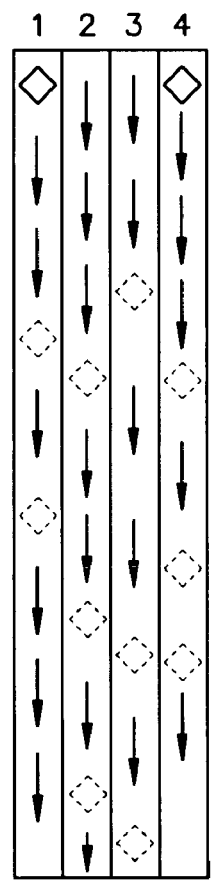
FIG. 8 is a schematic illustration of a mask aperture excursion through a ribbon ion beam according to one embodiment of the present invention.

FIG. 8 illustrates one possible excursion path that is traced by the aperture 72 through the ribbon ion beam 42. The aperture width is approximately one fourth of the height of the ribbon beam so that four traversals along the width of the beam are necessary to scan the entire beam. The aperture starts at position 1 and then after completed a linear traversal of the width of the beam, moves over to position 2 and scans linearly again and so on. The current density measured at each aperture location is used to construct a beam profile. Other aperture excursions are possible by, for example, varying the helical angle of the slots in the masks, the number of slots in the masks, and the relative speed of rotation.

As can be seen from the above description, the described profiler permits rapid collection of two dimensional ion beam current density profile data that can be used advantageously for beam tuning, dosimetry, and glitch detection. Although the present invention has been described with a degree of particularity, it is the intent that the invention include all modifications and alterations from the disclosed design falling within the spirit or scope of the appended claims.

We claim:

1. An ion beam dosimetry apparatus comprising:
    a conducting surface that produces a current in response to the impact of ions in the ion beam and that corresponds to a dose of ions present in the ion beam;
    a pair of overlaid concentric cylindrical masks each having at least one helical slot formed therein, wherein the slots intersect to form a movable aperture disposed between an ion beam source and the conducting surface that moves when at least one of the masks is moved relative to the other.

2. The apparatus of claim 1 wherein the conducting surface is an outer surface of a hollow rod made of a conductive material.

3. The apparatus of claim 2 comprising at least one of cylindrical cusp suppression magnet disposed within the hollow rod wherein the at least one cusp magnet is aligned axially with the hollow rod.

4. The apparatus of claim 1 wherein the aperture is smaller than a width and height of the ion beam.

5. The apparatus of claim 1 wherein the slots are configured such that relative motion between the masks causes the aperture to trace a scanning pattern across the beam such that all areas of the beam are encountered by the aperture during the scanning pattern.

6. The apparatus of claim 1 wherein the overlaid masks and conducting surface are removably positioned between a workpiece mounting structure and the ion beam source.

7. The apparatus of claim 1 wherein the overlaid masks and conducting surface are positioned behind a workpiece support structure such that the overlaid masks and conducting surface are downstream of the workpiece support structure with respect to the path of the ion beam.

8. The apparatus of claim 1 comprising a cylindrical suppression element disposed between the inner cylindrical mask and the conducting surface.

9. A method for creating an ion dosage profile of an ion beam directed along a path from an ion source to a workpiece support structure comprising:
    positioning a current collecting surface in the ion beam path;
    creating an ion beam aperture in the ion beam path by moving relative to one another two overlapping concentric cylindrical masks each having a helical slot such that an aperture is created by the intersection of the overlapping slots, wherein the aperture scans the ion beam prior to the ion beam impacting the current collecting surface; and
    measuring a current induced in the current collecting surface by ions impacting the surface through the aperture to determine a beam profile to calculate an ion dosage profile.

10. The method of claim 9 wherein the ion dosage profile is calculated by translating a time-dependence of the measured current to a spatial distribution of beam current density.

11. The method of claim 9 wherein the current collecting surface is positioned upstream of the workpiece support structure with respect to the ion beam path.

12. The method of claim 9 wherein the current collecting surface is positioned downstream of the workpiece support structure with respect to the ion beam path.

13. The method of claim 12 wherein the cylinders are rotated in opposite directions.

14. The method of claim 13 wherein the speed of rotation of one of the cylinders is much higher than the speed of rotation of the other cylinder.

15. The method of claim 9 comprising positioning an electron suppressor between said collecting surface and said aperture.

16. The method of claim 9 comprising positioning an electron suppressor behind said collecting surface with respect to said aperture.

* * * * *